(12) United States Patent  (10) Patent No.: US 8,618,600 B2
Slesazeck                    (45) Date of Patent:     Dec. 31, 2013

(54) INTEGRATED CIRCUIT INCLUDING A BURIED WIRING LINE

(75) Inventor: Stafan Slesazeck, Dresden (DE)

(73) Assignee: Qimonda AG, Munich (DE)

( * ) Notice: Subject to any disclaimer, the term of this patent is extended or adjusted under 35 U.S.C. 154(b) by 1106 days.

(21) Appl. No.: 12/135,318

(22) Filed: Jun. 9, 2008

(65) Prior Publication Data

US 2009/0302392 A1    Dec. 10, 2009

(51) Int. Cl.
    *H01L 29/66*    (2006.01)
(52) U.S. Cl.
    USPC ........... 257/330; 257/329; 257/331; 257/332; 257/E29.13; 257/E29.201
(58) Field of Classification Search
    USPC ............... 257/329, 330, 331, 332, E29.13, 257/E29.201, E29.621, E29.624
    See application file for complete search history.

(56) References Cited

U.S. PATENT DOCUMENTS

| 5,443,992 | A  | * | 8/1995 | Risch et al. ................... 438/270 |
| 5,502,320 | A  | * | 3/1996 | Yamada ........................ 257/302 |
| 7,763,514 | B2 | * | 7/2010 | von Kluge et al. ............. 438/259 |

* cited by examiner

*Primary Examiner* — Eduardo A Rodela
(74) *Attorney, Agent, or Firm* — Dicke, Billig & Czaja, PLLC

(57) ABSTRACT

Integrated circuits including a buried wiring lien. One embodiment provides a field effect transistor including a first active area and a gate electrode buried below a main surface of a semiconductor substrate. A gate wiring line may be buried below the main surface and a section of the gate wiring line may form the gate electrode. Above the gate wiring line, a buried contact structure is formed that is adjacent to and in direct contact with the first or a second active area.

21 Claims, 12 Drawing Sheets

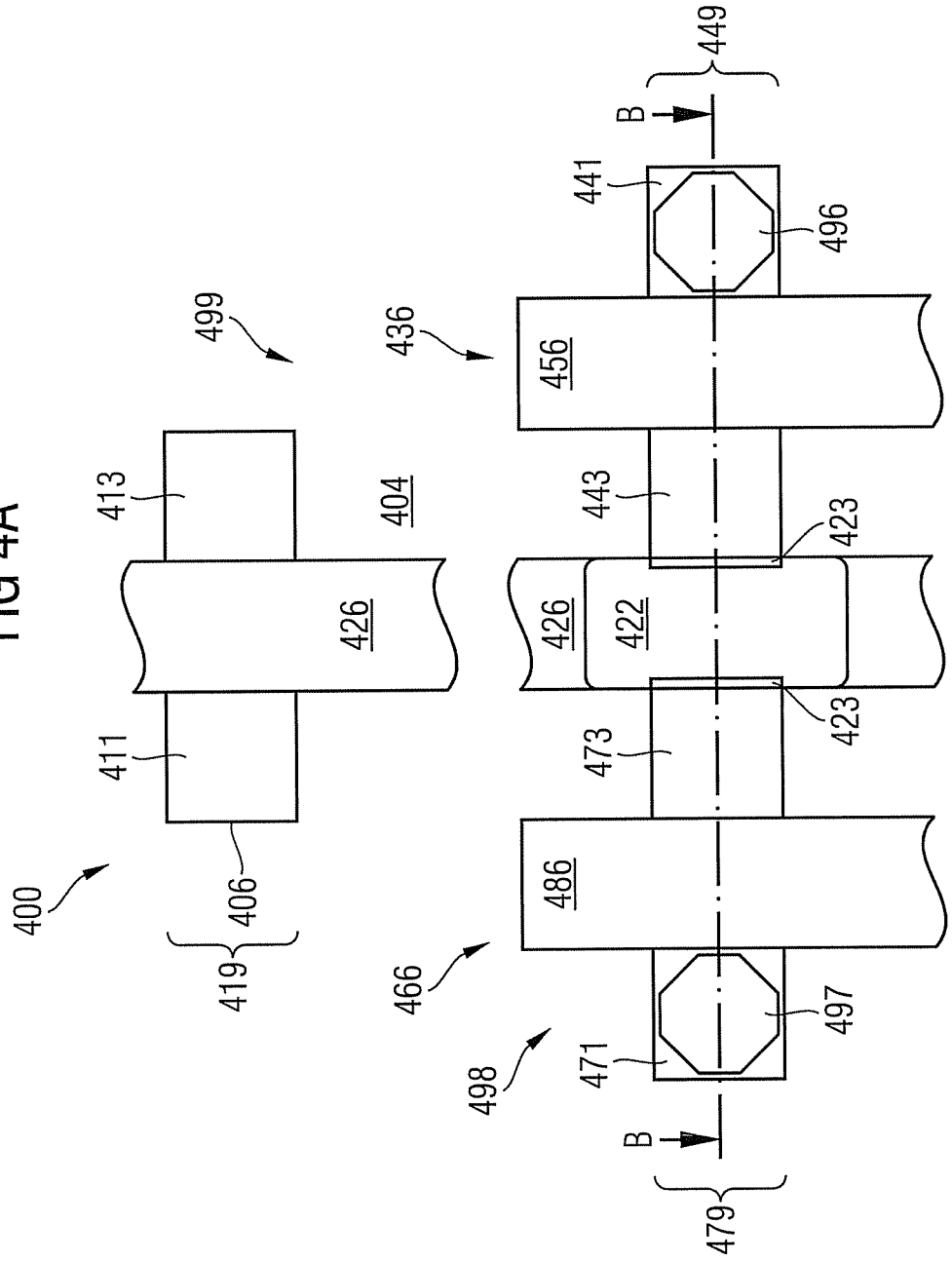

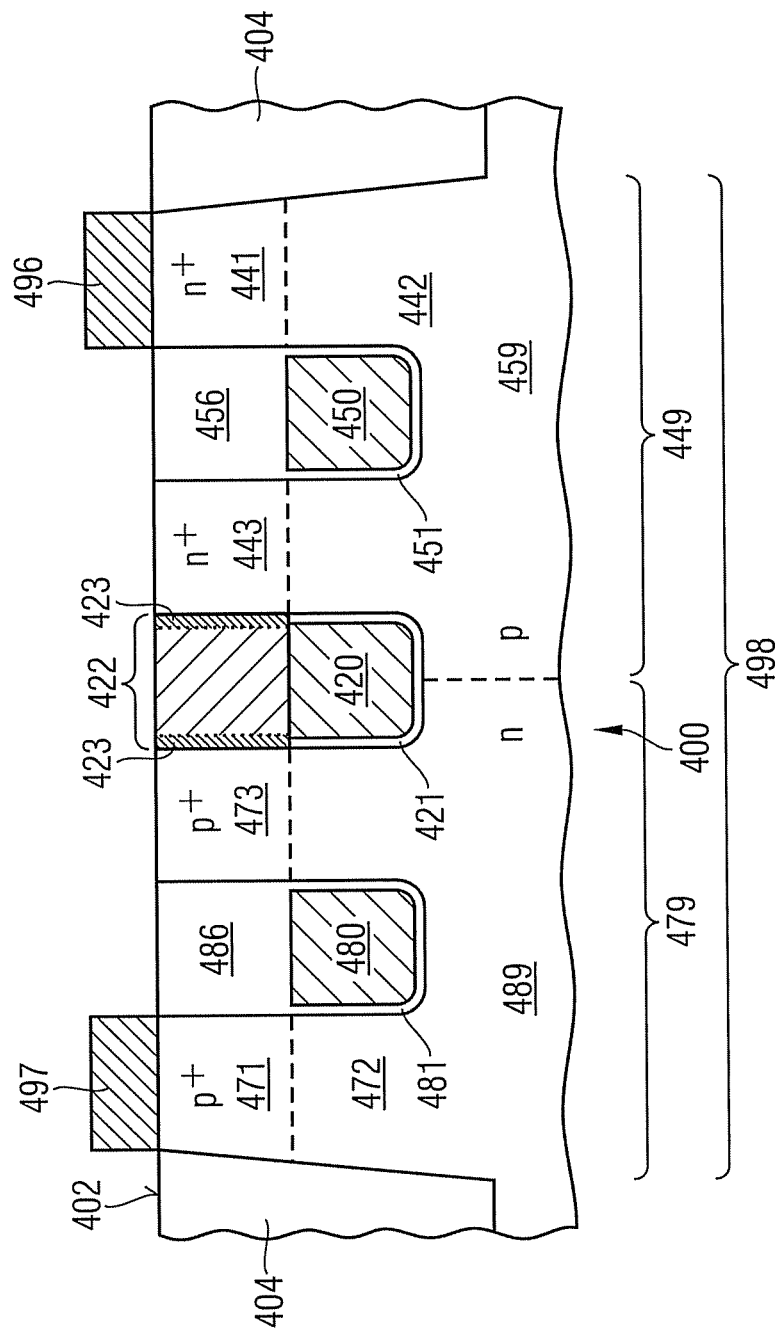

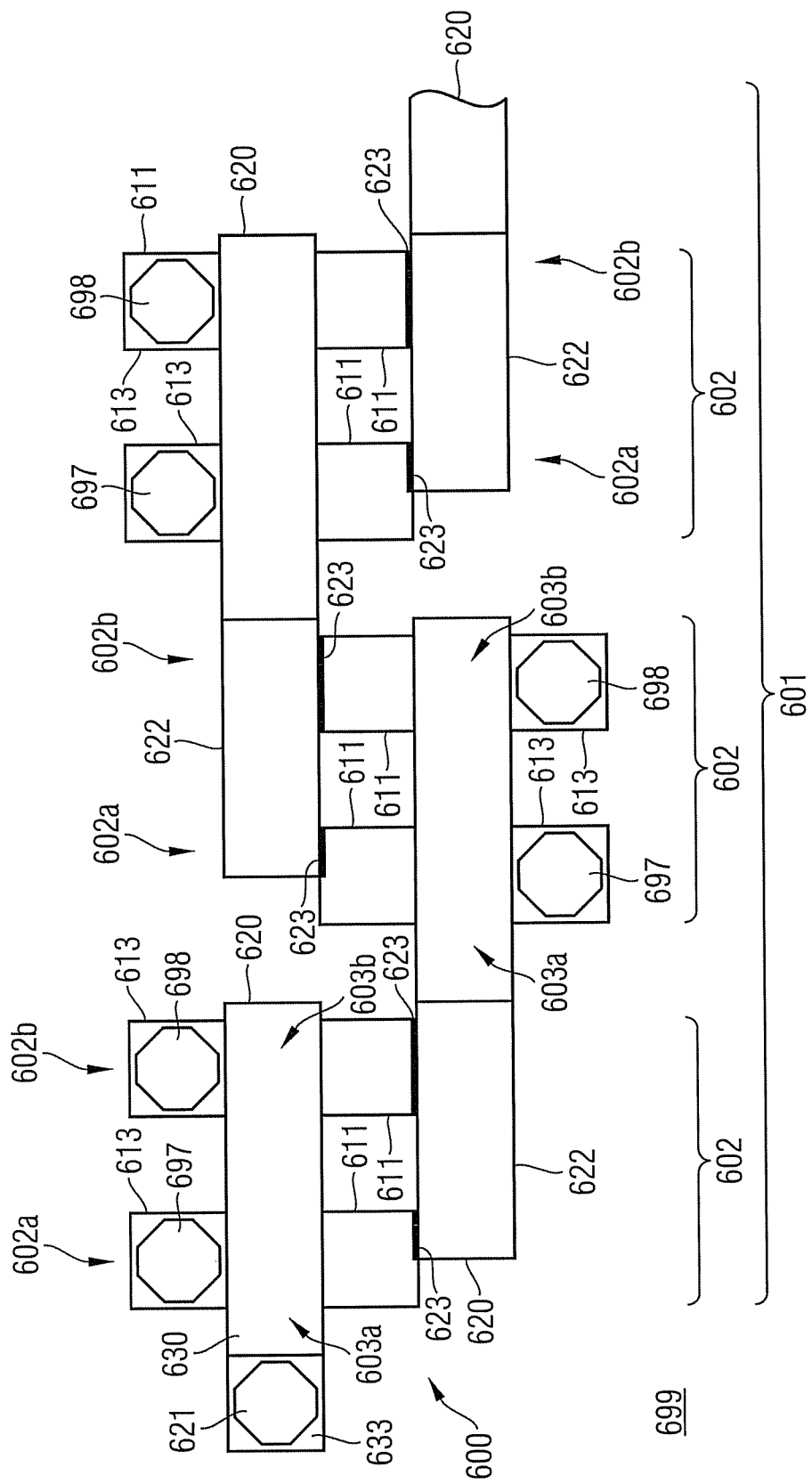

INTEGRATED CIRCUIT INCLUDING A BURIED WIRING LINE

BACKGROUND

In integrated circuits, wiring connects a plurality of electronic elements such as field effect transistors (FETs), capacitors, resistors and/or diodes to form functional electronic circuits. Typically, the electronic elements are arranged along a main surface of a semiconductor substrate such as a silicon wafer or a SoI (silicon-on-insulator) wafer. The wiring may be provided in several wiring layers, wherein interlevel dielectric layers are disposed between the wiring layers and between the bottom wiring layer and the main surface. Vertical contact structures (vias) connect wiring lines of different wiring layers with each other and with the electronic elements provided on or in the semiconductor substrate.

In some applications, each terminal of an electronic element, for example, a field effect transistor, may be connected to one or more of the wiring layers. Shrinking in size of the elements on the main surface results in dense contact arrangements. In order to relax overlay requirements and process windows, the contacts are conventionally arranged in a sufficient distance to each other such that the contact arrangement of an electronic element may consume more area than the electronic element itself. For example, the overall area of the contact arrangement of a 3D field effect transistor, which includes at least one channel section that is not oriented along a surface parallel to the main surface, like an EUD (extended U-groove device), a vertical field effect transistor, a recess channel transistor, or a FinFET, may be greater than the planar cross-section of the active area of the 3D field effect transistor.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 4A-4B illustrate respectively a plan view and a corresponding cross-sectional view of a portion of an integrated circuit including a 3D field effect transistor and a buried gate wiring line connected to an inverter circuit according to one embodiment.

FIG. 6 is a plan view of a portion of an integrated circuit including a ring oscillator including a plurality of buried gate wiring lines in accordance with one embodiment.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1A:
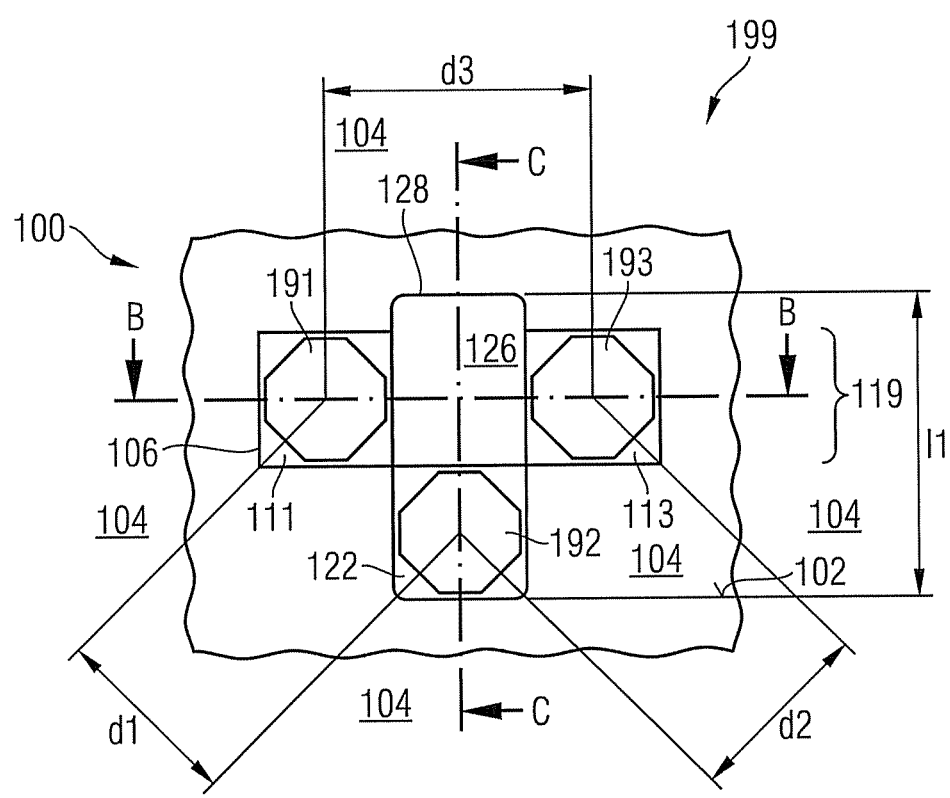
FIGS. 1A-1C illustrate respectively a plan view and two corresponding cross-sectional views of a portion of an integrated circuit including a 3D field effect transistor and a short buried gate wiring line in accordance with one embodiment.

FIG. 1A is a plan view onto a portion of an integrated circuit 199 including a field effect transistor 106 that is formed in a substrate 100. The substrate 100 may be, by way of example, a preprocessed single crystalline silicon wafer or a silicon-on-insulator wafer and may include further doped and undoped sections, epitaxial semiconductor layers supported by a base conductor or a base insulator as well as other semiconductor and insulator structures that have previously been fabricated. Insulator structures 104 may be introduced from a main surface 102 into the substrate 100 to define an active area 119 of the field effect transistor 106, wherein the insulator structures 104 may adjoin the active area 119 on all or at least on two opposing sides. The insulator structures 104 may include or consist of doped or undoped, thermal grown or deposited silicon oxide or silicon dioxide or another dielectric material. The active area 119 includes a first and a second source/drain region 111, 113 that adjoin the main surface 102. A gate trench structure 128 may be disposed between the first and the second source/drain regions 111, 113 and may separate them from each other. Contacts 191, 193 may be provided to electrically couple the first and second source/drain regions 111, 113 to wiring lines disposed in wiring layers above the main surface 102.

Figure 1B:
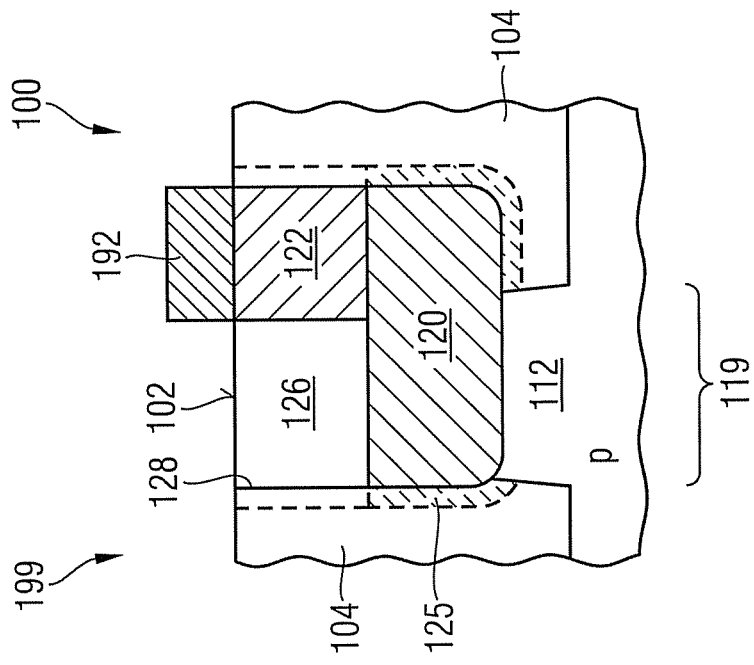

According to FIG. 1B, which is a cross-section along line B-B of FIG. 1A, a lower edge of the gate trench structure 128 may have a greater distance to the main surface 102 than the lower edges of the first and second source/drain regions 111, 113, which are of a first conductivity type. A channel region 112 of a second conductivity type, which is the opposite of a first conductivity type, connects the first and second source/drain regions 111, 113 within the active area 119. In accordance with one embodiment illustrated in FIG. 1B, the first conductivity type is the n-type. In accordance with another embodiment the first conductivity type may be the p-type. The active area 119 may have two opposing first sides and two opposing second sides, wherein here and in the following the first sides are defined as extending along a connection line between the respective first and second source/drain regions. The first sides may be shorter or longer than the second sides or they may have the same length as the second sides.

A buried gate wiring line 120 fills a lower portion of the gate trench structure 128. A gate dielectric liner 121 may be disposed between the active area 119 and the buried gate wiring line 120 such that a section of the buried gate wiring line 120 is effective as a gate electrode of the field effect transistor 106 and the gate dielectric liner 121 or a section thereof is effective as the gate dielectric. The gate dielectric liner 121 may be a thermally grown silicon oxide layer. According to other embodiments, the gate dielectric liner 121 may be a deposited silicon oxide, for example a silicon dioxide, which may be nitrided afterwards, or another oxide or silicon oxide of elements of the third or fourth group including oxides of rare earth, for example $Al_2O_3$, $HfO_2$, $HfSiO_2$, $CrSiO_2$, $DySiO_2$ or another high-k material. The gate wiring line 120 may include or consist of, for example, n-doped or p-doped polysilicon or a metal or metal compound having a suitable work function. For example, the gate wiring line 120 may have a layered structure with, for example, a polysilicon layer, which is in first sections in contact with the gate dielectric 121 and in second sections in contact with the insulator structure 104, a diffusion barrier layer bearing on the polysilicon layer and a metal layer, for example a tungsten layer, bearing on the diffusion barrier layer. A further barrier or interface layer may be formed along the upper edge of the gate wiring line 120.

The upper edge of the gate wiring line 120 may be approximately flush with one or both lower edges of the first and second source/drain regions 111, 113. According to other embodiments, the gate dielectric liner 121 and/or the gate wiring line 120 may overlap one or both source/drain regions 111, 113. According to further embodiments, the upper edge of the gate wiring line and/or the gate dielectric liner 121 may have a greater distance to the main surface 102 than the lower edge of one or both first and second source/drain regions 111, 113.

Figure 1C:
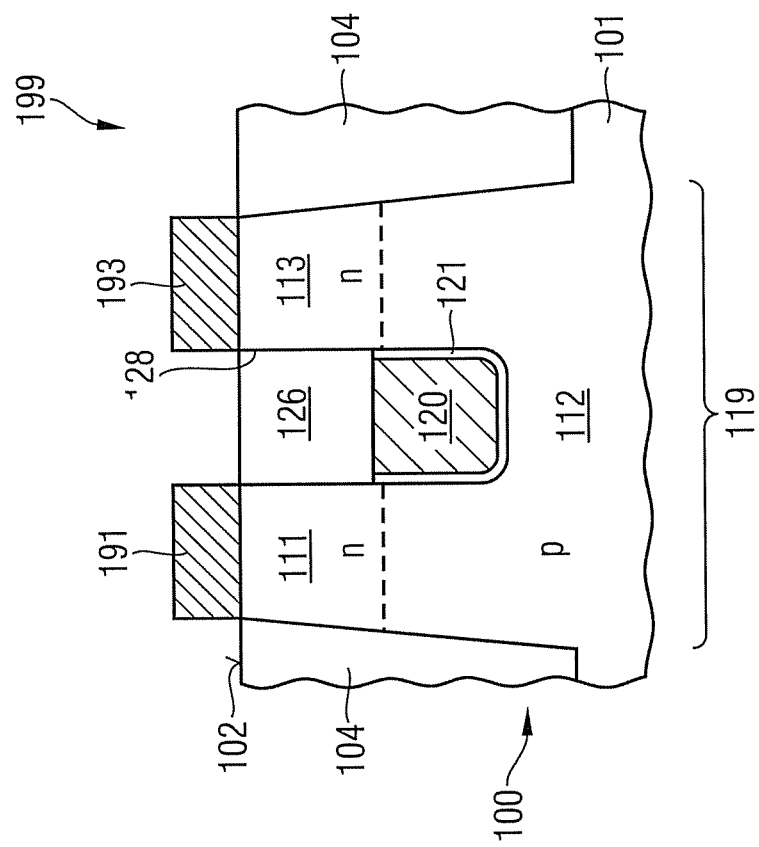

Referring to FIG. 1C, which is a cross-section along line C-C in FIG. 1A, the integrated circuit 199 includes further a buried contact structure 122 that is formed as part of the gate trench structure 128 and that may extend between an upper edge of the buried gate wiring line 120 and approximately the main surface 102. The buried contact structure 122 is in direct low-resistance contact with the gate wiring line 120 and may be without direct contact to the first and second source/drain regions 111, 113 or may be in direct low-resistance contact with one of them. The buried contact structure 122 may include or consist of n-doped or p-doped polysilicon, a metal or a metal compound and may illustrate a layered structure including a high conductive layer and one or more barrier and interface layers. As understood herein, a structure is considered buried below a surface when it is at least partially recessed within it. Accordingly, a top surface of the buried contact structure 122 may be approximately flush with the main surface 102 or may be recessed with respect to the main surface 102.

Referring further to the cross-sectional view of FIG. 1C, the gate trench structure 128 may extend along the dotted line such that extension portions 125 of the gate wiring line 120 may extend along a section of the first sides of the active area 119, wherein the gate wiring line 120 encloses a portion of the channel region 112 on more than one side, for example on three sides as illustrated in FIG. 1C. The extension portions 125 may result, by way of example, from filling pockets between the insulator structures 104 and the active area 119, wherein the pockets may be formed through an isotropic etch of a section of the insulator structures 104 after the formation of a groove, in which the gate trench structure 128 will be provided, and prior to the formation of the buried gate wiring line 120 within the groove. The active area 119 may further include two lamella-like rails formed from the semiconductor substrate 100 and extending along the corners of the active area 119 within at least a portion of the channel region 112.

A further contact 192 may electrically couple the buried contact structure 122 to one or more wiring lines disposed in the wiring layers above the main surface 102. The gate trench structure 128 includes further an insulator fill 126 disposed between the main surface 102 and an upper edge of the gate wiring line 120. The insulator fill 126 may separate the buried contact structure 122 and one or both first and second source/drain regions 111, 113. The contacts 191-193 may include or consist of n-doped or p-doped polysilicon, a metal or a metal compound and may illustrate a layered structure including a high conductive layer and one or more barrier and interface layers. The insulator "fill" 126 may be a low-k dielectric, for example a doped or not-doped silicon oxide or silicon dioxide or a covered void or gap.

Referring again to FIG. 1A, a length l1 of the gate wiring line 120 may be selected such that a distance or pitch d1, d2 between the buried contact structure 122 and one of the source/drain regions 111, 113 is not greater than two times the distance or pitch d3 between the first and the second source/drain regions 111, 113.

In accordance with one embodiment, a first distance d1 between the first source/drain region 111 and the buried contact structure 122 may be approximately equal to a second distance d2 between the second source/drain region 113 and the buried contact structure 122 such that the contacts 191-193 are arranged at the corners of an isosceles triangle. A second, identical field effect transistor which is oriented reflection symmetric against an axis of symmetry parallel to the intersection line B-B may be provided in a distance equal to the third distance d3 to the first field effect transistor 106 in the direction defined by the intersection line B-B. The second contact of the second field effect transistor is then situated in the projection of the connection line between the first 191 and the third contact 193 of the first field effect transistor 106 and the second contact 192 of the first field effect transistor is situated in the projection of the connection line between the first and the third contact of the second field effect transistor. The two mirror-inverted field effect transistors may form a base element that may be multiplied along the B-B intersection line to form a transistor column of field effect transistors with evenly spaced contacts arranged along two straight lines. A plurality of transistor columns may be arranged next to each other to form a transistor array. The transistor columns may be arranged in a distance to each other which is equal to the distance between the second contact 122 and a center line of the active area parallel to the intersection line B-B. In the transistor array, a plurality of field effect transistors 100 is arranged in a regular matrix with the contacts 191-193 situated at the nodes of a virtual grid with identical rhomboid meshes such that resolution enhancement techniques, like the use of higher diffraction orders during exposure, facilitate transistor dimensions and distances between the transistors that are smaller than the nominal resolution limit at the respective illumination wavelength.

In accordance with a further embodiment, the distances d1, d2 may be approximately equal to or smaller than the third distance d3. By way of example, the contacts 191-193 may be arranged at the corners of an equilateral triangle, wherein, in a transistor array as described above, the four sides of each rhomboid mesh may have the same length such that the use of resolution enhancement techniques may be further simplified and/or extended.

Considering the fact that the source/drain regions 111, 113 and the buried contact structure 122 may be formed in a first lithography process using a first mask and the contacts 191, 192, 193 may be formed in a second lithography process using a second mask, the alignment requirements concerning the second mask may be equal and isotropic in view of all three contacts 191, 192, 193 by spacing them evenly, wherein the fabrication process may be simplified further.

According to another embodiment, the distances d1, d2 may be equal to or greater than d3*0.5*SQRT(2) respectively. By way of example, the first and the second distances d1, d2 may be equal to half the third distance d3 multiplied with the square root of 2. In this case, the contacts 191, 192, 193 are arranged at three corners of a virtual square with a diagonal line between the first and the third contacts 191, 193. A plurality of field effect transistors may be arranged along a direction defined by the intersection line C-C and directly adjoining each other to form a transistor column, wherein the first, second and third contacts 191-193 of the field effect transistors are situated equidistantly along lines parallel to the intersection line C-C, respectively. The buried gate wiring line may be provided shorter than that illustrated in FIG. 1C and the buried contact structure 122 may be shifted in direction of the source/drain regions 111, 113 in order to avoid short circuits between the gate electrodes of neighboring field effect transistors.

A plurality of transistor columns may be arranged directly adjoining each other along the direction defined by intersection line B-B to form a transistor array, wherein neighboring transistor columns are shifted against each other by a distance equal to d3*0.5 along the direction defined by intersection line C-C such that the contacts 191, 192, 193 in the transistor array are arranged at the nodes of a virtual, regular grid with rectangular, quadratic meshes, wherein the use of resolution enhancement techniques is simplified further In accordance with another embodiment, the buried contact structure 122 is formed in the area of the insulator structures 104 next to the projection of the active area 119.

Figure 2A:
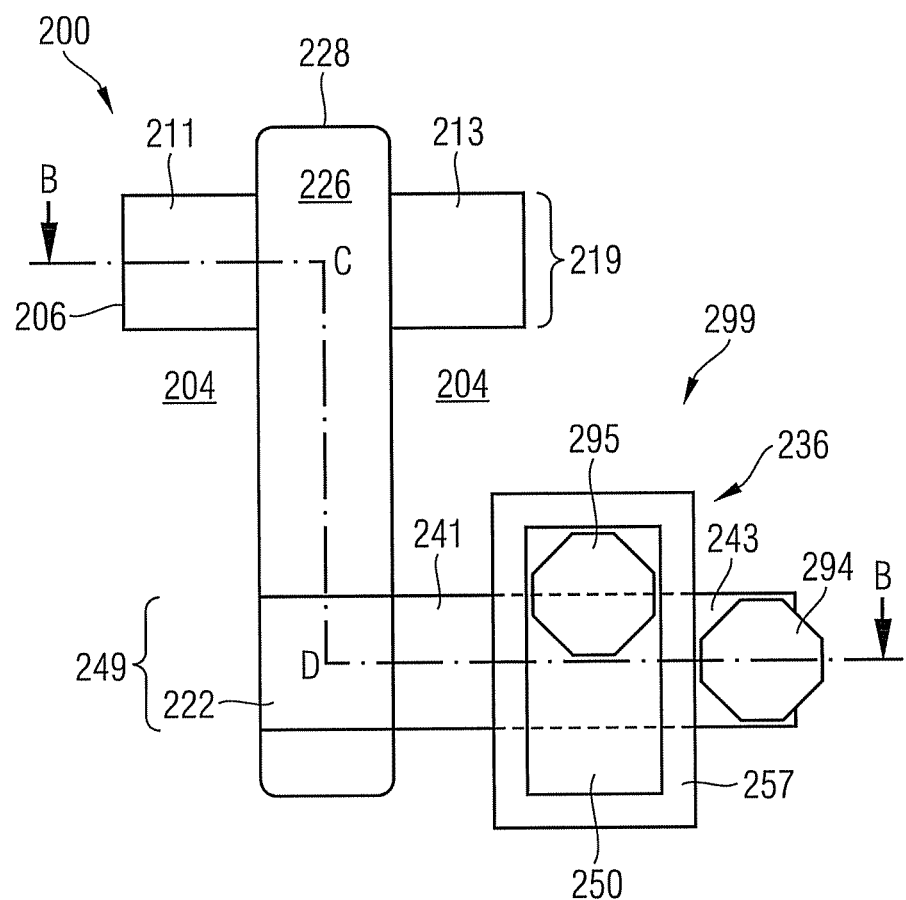
FIGS. 2A-2B illustrate respectively a plan view and a corresponding cross-sectional view of a portion of an integrated circuit including a 3D field effect transistor and a buried gate wiring line connected to a planar field effect transistor according to one embodiment.
Figure 2B:
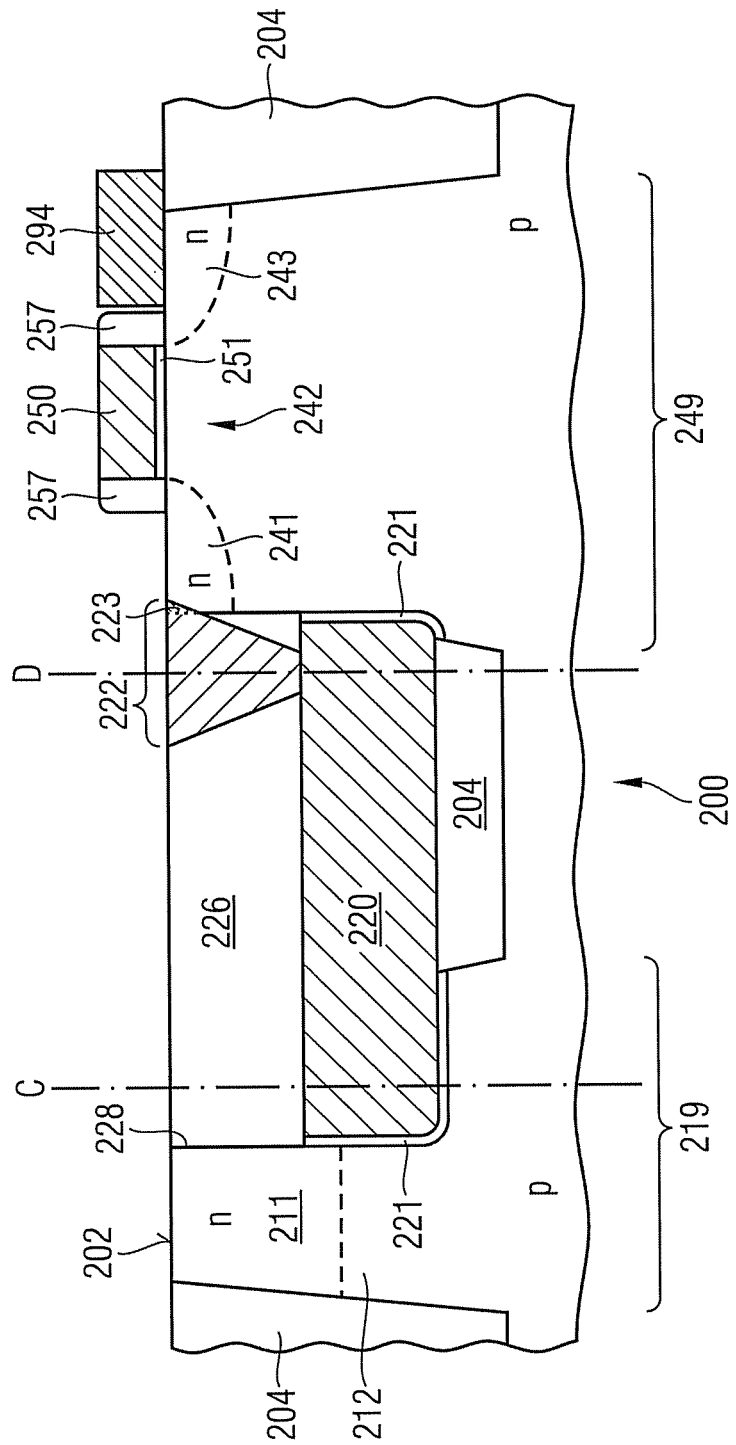

FIG. 2A is a plan view of a section of an integrated circuit 299 including a first field effect transistor 206 and a second field effect transistor 236 that is connected to the first field effect transistor 206 via a buried contact structure 222 and a buried gate wiring line 220 as illustrated in FIG. 2B. A first active area 219 associated with the first field effect transistor 206 and a second active area 249 associated with the second field effect transistor 236 are formed from a single crystalline semiconductor portion of a substrate 200 between insulator structures 204 that may be disposed in grooves formed in a main surface of the substrate 200. The first active area 219 includes a first and a second source/drain region 211, 213 adjacent to the main surface. A gate trench structure 228 is disposed between the first and the second source/drain regions 211, 213 and separates them from each other. According to one embodiment, one or two contacts may electrically couple the first and/or the second source/drain region 211, 213 to wiring lines disposed in wiring layers above the main surface 202. The first field effect transistor 206 may be based on the same materials and embodiments as the field effect transistor 106 of FIG. 1.

The second field effect transistor 249 may be a planar one with a further first source/drain region 241, a further second source/drain region 243, and a further channel region 242 as illustrated in FIG. 2B adjoining the main surface 202. A second gate electrode 250 that is configured to control a current flow between the further first and second source/drain regions 241, 243 is disposed above the main surface 202. Sidewall spacers 257 may extend along vertical sidewalls of the gate electrode 250. In accordance with one embodiment, at least one contact 294 may be disposed on at least one of the further first and second source/drain regions 241, 243, for example on the further second source/drain region 243. In accordance with other embodiments, the further first and second source/drain regions 241, 243 are connected via further buried contact structures. The second gate electrode 250 and a second gate dielectric 251 that is arranged between the second gate electrode 250 and the second active area 249 may base on the same materials as the gate electrode and the gate dielectric liner 221 of the field effect transistor 106 of FIG. 1. The sidewall spacers 257 may include or consist of silicon oxide and/or silicon nitride or may have a layered structure including different dielectric layers.

The gate trench structure 228 extends between the first active area 219 and the second active area 249. The first and second active areas 219, 249 may extend along the same direction, such that they run parallel to each other. According to another embodiment, they extend along intersecting directions, for example along directions perpendicular to each other. The gate trench structure 228 may intersect the first active area 219 completely and may extend along the second side, which may be the shorter one, or along a portion of the first side of the second active area 249, which may be the longer one. The gate trench structure 228 may intersect further active areas or may extend along further active areas accordingly. In accordance with other embodiments, the gate trench structure 228 may intersect a portion of the second active area 249, for example the further first or the further second source/drain region 241, 243. A lower edge of the gate trench structure 228 may have a smaller distance to the main surface 202 than the lower edge of the insulator structures 204.

FIG. 2B is a cross section along line B-B of FIG. 2A. Referring to the left hand side of FIG. 2B, a lower edge of the gate trench structure 228 may have a greater distance to the main surface 202 than the lower edges of the first and second source/drain regions 211, 213, which are of a first conductivity type. A channel region 212 of a second conductivity type, which is the opposite of a first conductivity type, connects the first and second source/drain regions 211, 213 within the first active area 219. In accordance with one embodiment, the first conductivity type is the n-type and in accordance with another embodiment the first conductivity type is the p-type.

A buried gate wiring line 220 is disposed in a lower portion of the gate trench structure 228 and a gate dielectric liner 221 is arranged between the first and second active areas 219, 249 on one hand and the gate wiring line 220 on the other hand. A section of the buried gate wiring line 220 which overlaps with the first active area 219 is effective as a gate electrode of the first field effect transistor 206 and a section of the gate dielectric liner 221 separating the first active area 219 and the gate wiring line 220 is effective as the gate dielectric. The gate dielectric liner 221 and the gate wiring line 220 may be based on the materials and may have the characteristics as described with respect to the gate dielectric liner 121 and the gate wiring line 120 of FIG. 1.

The upper edge of the gate wiring line 220 may be approximately flush with one or both lower edges of the first and second source/drain regions 211, 213. According to other embodiments, the gate dielectric liner 221 and/or the gate wiring line 220 may overlap one or both source/drain regions 211, 213. According to further embodiments, the upper edge of the gate wiring line 220 and/or the gate dielectric liner 221 may have a greater distance to the main surface 206 than the lower edge of one or both first and second source/drain regions 211, 213.

A buried contact structure 222 is formed as part of the gate trench structure 228 and extends between an upper edge of the gate wiring line 220 and the main surface 202. The buried contact structure 222 is in direct low-resistance contact with the gate wiring line 220 and with the further first source/drain region 241. The buried contact structure 222 may include or consist of n-doped or p-doped polysilicon, a metal or a metal compound and may illustrate a layered structure including a high conductive layer and one or more barrier and interface layers. For example, the buried contact structure 222 may include a silicide liner 223 formed along the interface to the further first source/drain region 241.

A tapered sidewall in connection with a suitable predefined distance between the buried contact structure 222 and the second active area 249 may avoid a direct contact between the buried gate wiring line 220 and a doped well 219 within which the further first and second source/drain regions 241, 243 are formed. In accordance with a further embodiment, the further first source/drain region 241 may be extended along the interface of the second active area 249 and the gate trench structure 228 via a diffusion process or a tilted implant. In accordance with another embodiment, the further first source/drain region 241 may be provided with a lower edge below the upper edge of the gate dielectric liner 221.

The gate trench structure 228 may further include an insulator fill 226 disposed between the main surface 202 and an upper edge of the gate wiring line 220. The insulator fill 226 may insulate, by way of example, the buried contact structure 222 from one or both first and second source/drain regions 211, 213 or the buried gate wiring line 220 and further conductive structures that are disposed on or above the main surface 202 between the first and the second active areas 219, 249. As a result, the first and the second field effect transistors 206, 236 may be connected to each other without contacts above the main surface 202 and without contact vias to other wiring layers.

Figure 3A:
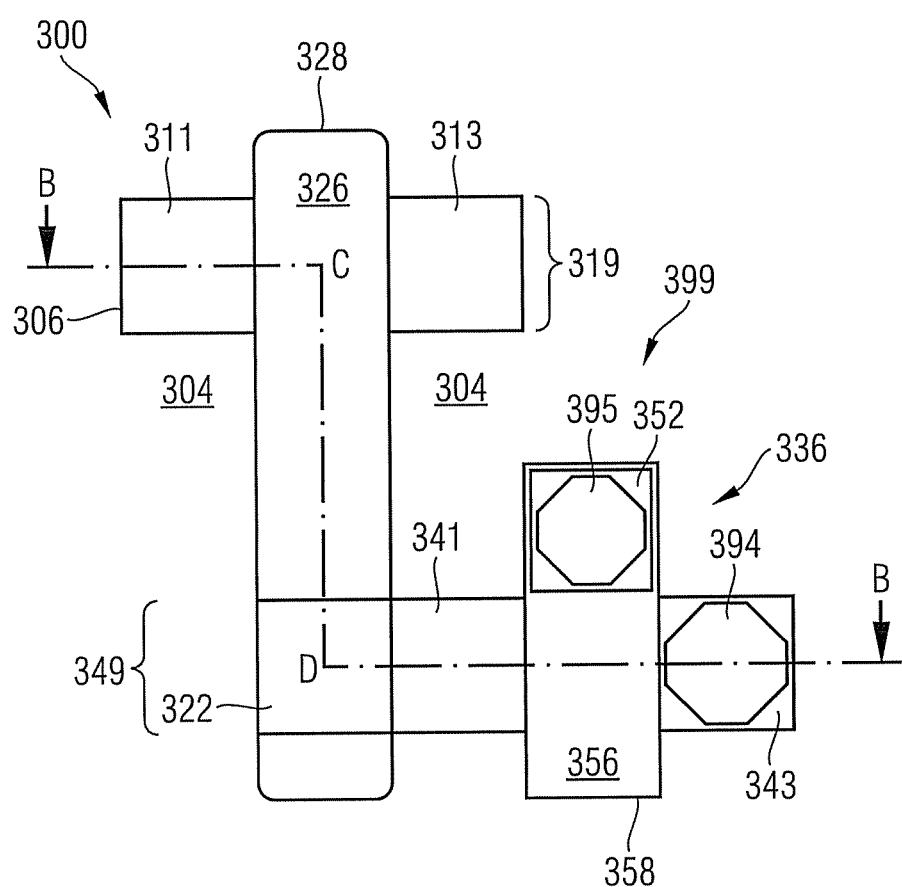
FIGS. 3A-3B illustrate respectively a plan view and a corresponding cross-sectional view of a portion of an integrated circuit including a 3D field effect transistor and a buried gate wiring line connected to a further 3D field effect transistor in accordance with one embodiment.

FIG. 3A is a plan view on a section of an integrated circuit 399 including a first 3D field effect transistor 306 and a second 3D field effect transistor 336 that is connected to the first 3D field effect transistor 306 via a buried gate wiring line which is part of a first gate trench structure 328. A first active area 319 associated with the first 3D field effect transistor 306 and a second active area 349 associated with the second 3D field effect transistor 336 are formed from a single crystalline semiconductor portion of a substrate 300 between insulator structures 304 introduced into a main surface 302 of the substrate 300. The first active area 319 includes a first and a second source/drain region 311, 313 that may be adjacent to the main surface 302. The first gate trench structure 328 is arranged between the first and the second source/drain regions 311, 313 and separates them from each other. The second active area 349 includes a further first and a further second source/drain region 341, 343 that may be adjacent to the main surface 302. A second gate trench structure 358 may be arranged between the further first and the second source/drain regions 341, 343.

The first gate trench structure 328 extends between the first active area 319 and the second active area 349. The first and second active areas 319, 349 may extend along the same direction, such that they are parallel to each other. According to another embodiment, they extend along intersecting directions, for example along directions perpendicular to each other. The first gate trench structure 328 may intersect the first active area 319 completely and may extend along the second side or along a portion of the first side of the second active area 349, wherein the first and second sides are defined as described above. In accordance with other embodiments, the first gate trench structure 328 may intersect a portion of the second active area 349, for example the further first or the further second source/drain region 341, 343. A lower edge of the gate trench structure 328 may have a smaller distance to the main surface 302 than the lower edge of the insulator structures 304. Further, a lower edge of the first gate trench structure 328 may have a greater distance to the main surface 306 than the lower edges of the first and second source/drain regions 311, 313, which are of a first conductivity type. A channel region 312 of a second conductivity type which is the opposite of a first conductivity type connects the first and second source/drain regions 311, 313 within the active area 319. In accordance with one embodiment, the first conductivity type is the n-type and in accordance with another embodiment the first conductivity type is the p-type.

The second gate trench structure 358 may intersect the second active area 349. A lower edge of the second gate trench structure 358 may have a smaller distance to the main surface 302 than the lower edge of the insulator structures 304. Further, a lower edge of the second gate trench structure 358 may have a greater distance to the main surface 302 than the lower edges of the further first and second source/drain regions 341, 343, which may be of the first or the second conductivity type. By way of example, the lower edge of the second gate trench structure 358 may be approximately flush with the lower edge of the first gate trench structure 328 and both gate trench structures 328, 358 may emerge from the same lithography and/or etch processes.

Figure 3B:
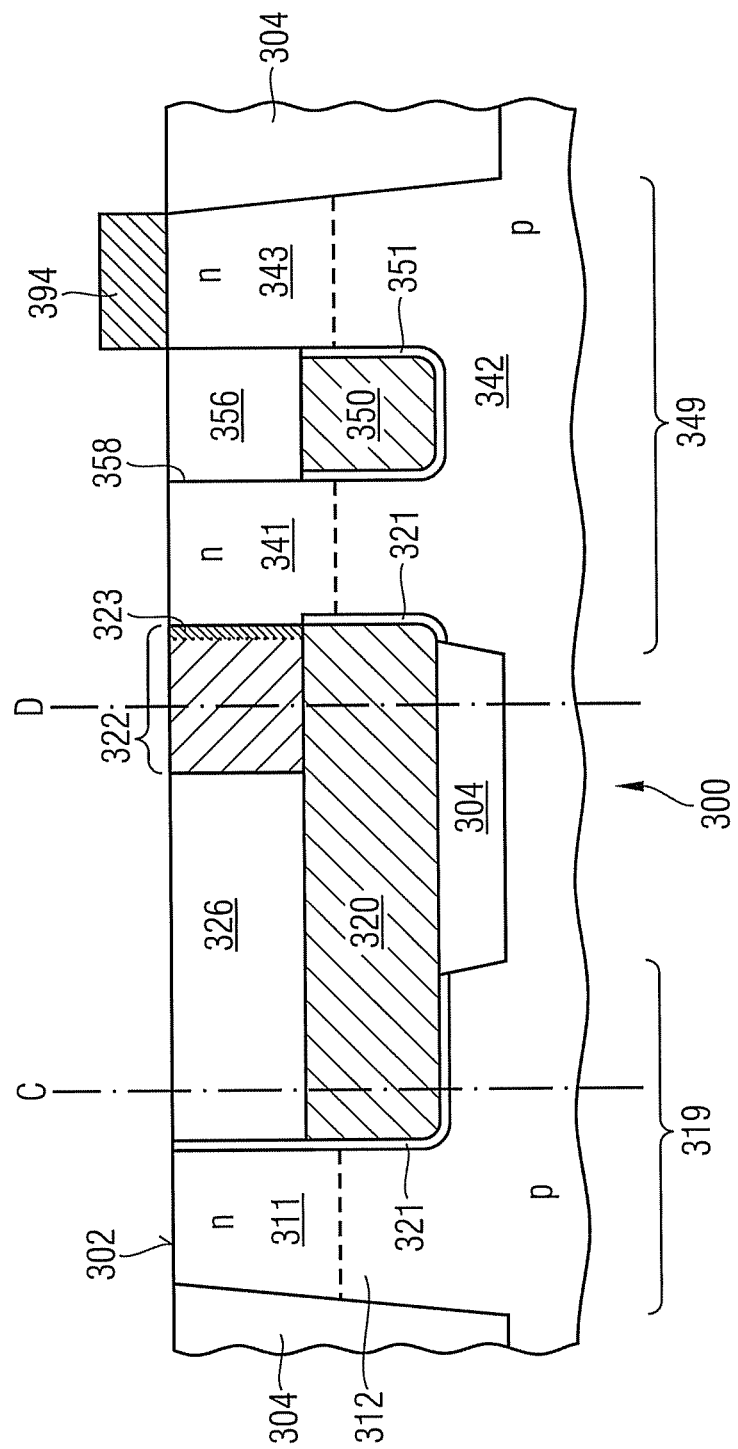

As illustrated in FIG. 3B, which is a cross-section along line B-B as illustrated in FIG. 3A, a channel region 342 of a conductivity type which is the opposite of that of the further first and second source/drain regions 341, 343 connects the first and second source/drain regions 341, 343 within the second active area 349.

A buried gate wiring line 320 fills a lower portion of the first gate trench structure 328 and a gate dielectric liner 321 is arranged between the first and second active areas 319, 349 on one hand and the first gate wiring line 320 on the other hand. A section of the first buried gate wiring line 320 which overlaps with the first active area 319 is effective as a gate electrode of the first 3D field effect transistor 306 and a section of the gate dielectric liner 321 separating the first active area 319 and the first gate wiring line 320 is effective as the gate dielectric.

A buried gate electrode 350 is disposed in a lower portion of the second gate trench structure 358 and a second gate dielectric 351 is arranged between the second active area 349 and the second gate wiring line 350. In accordance with one embodiment, the second gate dielectric 351 is a further section of the gate dielectric liner 321 and results from the same process. According to another embodiment, the second gate dielectric 351 is formed independently from the first gate dielectric liner 321 and may have a different composition and may include another material or other materials than the gate dielectric liner 321.

The gate dielectric liner 321, the second gate dielectric 351, the gate wiring line 320, and the second gate electrode 350 may base on the materials and embodiments as described with respect to the gate dielectric liner 121 and the gate wiring line 120 of FIG. 1.

The upper edge of the gate wiring line 320 and/or the second gate electrode 350 may be approximately flush with one or both lower edges of the further first and second source/drain regions 341, 343. According to other embodiments, the second gate dielectric 351 and/or the second gate electrode 350 may overlap one or both further source/drain regions 341, 343. According to further embodiments, the upper edge of the second gate electrode 350 and/or the second gate dielectric 351 may have a greater distance to the main surface 302 than the lower edge of one or both further first and second source/drain regions 341, 343.

The buried contact structure 322 is formed as part of the first gate trench structure 328 and extends between an upper edge of the gate wiring line 320 and the main surface 302. The buried contact structure 322 is in direct low-resistance contact with the gate wiring line 320 and with the further first source/drain region 341. The buried contact structure 322 may include or consist of n-doped or p-doped polysilicon, a metal or a metal compound and may illustrate a layered structure including a high conductive layer and one or more barrier and interface layers. For example, the buried contact structure 322 may include a silicide liner 323 formed at the interface to the further first source/drain region 341.

The gate trench structure 328 may include further an insulator fill 326 disposed between the main surface 302 and an upper edge of the gate wiring line 320. The insulator fill 326 may insulate, by way of example the buried contact structure 322 from one or both first and second source/drain regions 311, 313 or the buried gate wiring line 320 and further conductive structures that are disposed on or above the main surface 302 between the first and the second active areas 319, 349.

According to one embodiment, one or two contacts may electrically couple the first and/or the second source/drain region 311, 313 to wiring lines disposed in wiring layers above the main surface 302. A further buried contact structure 352 may couple the buried gate electrode 350 to a contact formed above the main surface 302. The buried contact structures 322, 352 may be formed simultaneously or independently from each other. The formation of the gate electrode 350 may be combined with that of the buried gate wiring line 320 such that no or only few more processes may be added.

In accordance with other embodiments, the buried gate wiring line 320 connects the first field effect transistor 306 in one embodiment with one or more other active areas, in which other electronic elements like diodes, resistors, delay lines, capacitor electrodes and others may be formed.

FIG. 4A is a plan view onto a section of an integrated circuit 499 including an inverter circuit 498 that includes an n-FET 436 and a p-FET 466. The p-FET 466 includes a first active area in which a first and a second p-doped source/drain region 471, 473 are formed and the n-FET 436 includes a second active area in which a first and a second n-doped source/drain region 443, 441 are formed, wherein each of the source/drain regions 441, 443, 471, 473 may adjoin to a main surface 402 of a substrate 400 from which the active areas are formed. A buried contact structure 422 is formed in a groove and between the second source/drain region 473 of the p-FET 466 and the second source/drain region 443 of the n-FET 436.

As illustrated in the cross-sectional view of FIG. 4B along line B-B of FIG. 4A, a lower edge of the groove has a greater distance to the main surface 402 than a lower edge of the second source/drain regions 473, 443 of the field effect transistors 436, 466. The buried contact structure 422 may include or consist of a conductive material like doped polysilicon, a metal or a metal compound and may have a layered structure including, for example, a diffusion barrier liner or conductive liners 423, for example silicide liners, which extend along the interfaces to the active areas 449, 479.

Contacts 496, 497 may bear on the first source/drain regions 441, 471 for connecting them to suitable supply voltage sources, which supply, for example, supply voltages Vdd or Vss, or to other signal lines. The field effect transistors 436, 466 may face each other at the buried contact structure 422. In accordance with another embodiment, they are arranged parallel to each other in an even or a staggered manner or they may be arranged perpendicular to each other with the second side of the first active area 479 oriented to one of the first sides of the second active area 449 or vice versa.

The buried contact structure 422 may bear directly on a section of a buried output line 420 of the inverter circuit 498. The buried output line 420 may be buried completely in a groove below the main surface 402. A dielectric liner 421 may be arranged between the buried output line 420 and the active areas 449, 479. An insulator fill 426 may be disposed above the buried output line 420 and between the buried contact structure 422 and adjacent insulator structures 404 facing each other at the respective active areas 449, 479. In accordance with one embodiment, the integrated circuit 499 may include a further buried contact structure bearing directly on another section of the buried output line 420. In accordance with another embodiment, the groove intersects a further active area 419 of a further field effect transistor 406 between a first and a second source/drain region 411, 413 of the further field effect transistor 406 and a further section of the gate dielectric liner 421 may be arranged between the buried output line 420 and the further active area 419 such that another section of the buried output line 420 may be effective as a gate electrode of the further field effect transistor 406. The output of the inverter circuit 498 may be directly connected with the gate electrode of the further field effect transistor 406 without contacts above the main surface 402.

A first gate electrode 480 configured to control the p-FET 466 and a second gate electrode 450 configured to control the n-FET 436 may also be buried below the main surface 402 such that the formation of the gate electrodes 450, 480 may be combined with the formation of the buried output line 420. For example, an upper edge of at least one of the first and second gate electrodes 450, 480 may be approximately flush with an upper edge of the buried output line 420. In addition, the formation of a first gate dielectric 481 of the p-FET 466 and a second gate dielectric 451 of the n-FET 436 may be combined with the formation of the dielectric liner 421.

Figure 5A:
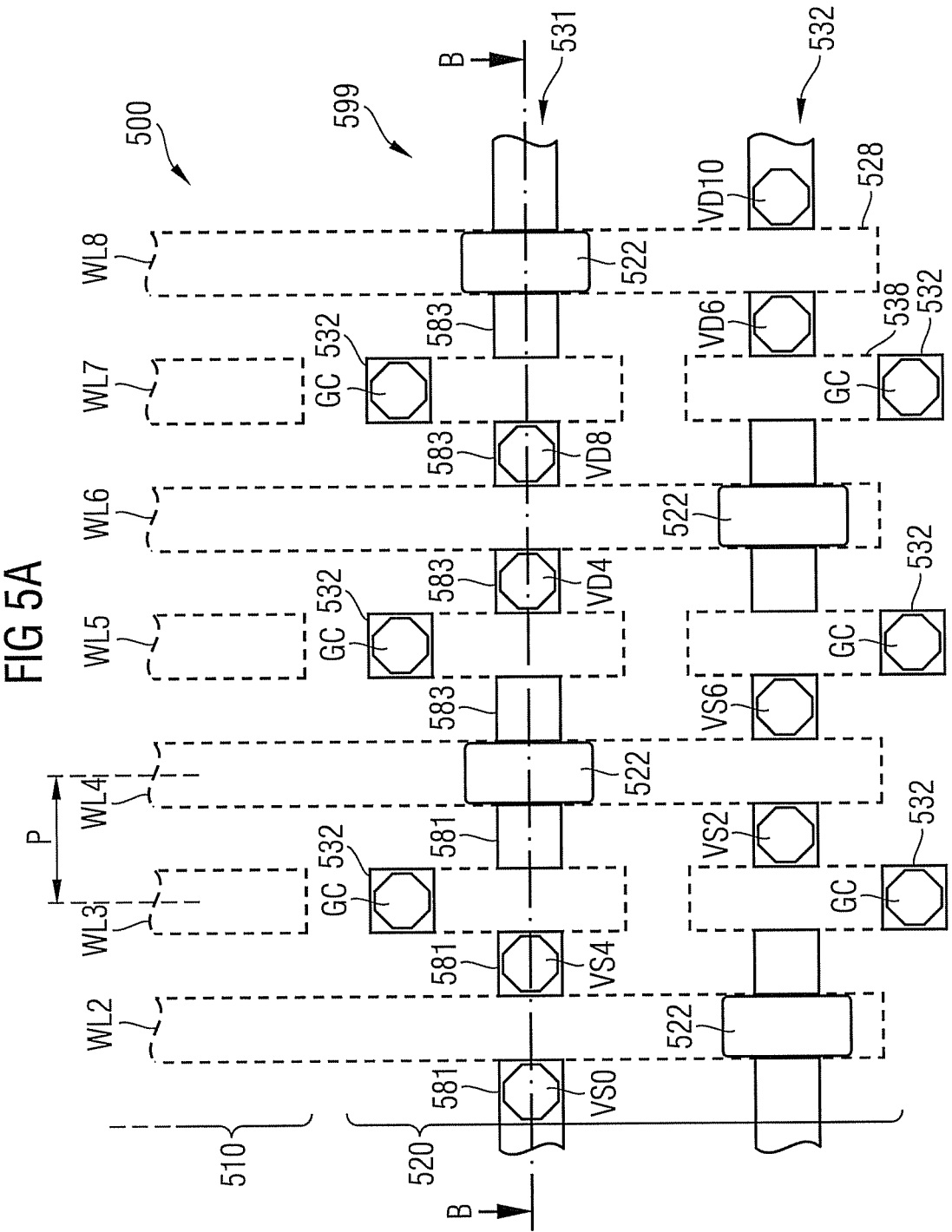
FIGS. 5A-5B illustrate respectively a plan view and a corresponding cross-sectional view of a portion of an integrated circuit including a cell array with a plurality of word lines connected to a word line driver circuitry via buried gate wiring lines in accordance with one embodiment.

FIG. 5A refers to a plan view of a section of an integrated circuit 599 including a cell array area 510 and a driver area 520 with driver circuits 541 that are configured to drive address lines WL2 . . . WL8, via which individual ones of cells provided in the cell array area 510 may be addressed. The cells may be memory cells like that one used for DRAMs (dynamic random access memories), PCRAMs (phase change random access memories), FeRAMs (ferroelectric random access memories), FBRAMs (floating body random access memories), MRAMs (magnetoresistive random access memories), EEPROMs (electrically erasable programmable read only memories), or sensor cells or display pixels. Each second address line WL2, . . . WL8 may extend at one edge of the cell array area 510 into the driver area 520. The other address lines WL3, WL5, . . . may extend at the opposing edge into a further driver area.

Each driver circuit 541 may include a p-FET 543 and an n-FET 542, which may be formed according to one of the field effect transistors as described with regard to one of the preceding figures. The n-FETs 542 and the p-FETs 543 may be arranged along active area lines 531, 532. In accordance with other embodiments, the n-FET 542 and the p-FET 543 of the same driver circuit 541 may be arranged parallel to each other, in a staggered manner or in a manner such that their first sides face each other at an intermediate insulator structure. By way of example, the driver circuit 541 may be an inverter circuit as described in detail with regard to FIGS. 4A-4B. A plurality of driver circuits 541 may be arranged along each of the active area lines 531, wherein neighboring driver circuits 541 face each other mirror-inverted at an intermediate insulating structure 543.

The address lines WL2... WL8 may be formed at a pitch P that may be determined by lithography, double patterning methods like pitch fragmentation or else. The driver circuits 541 may be formed in two parallel active area lines 531, 532. Each fourth address line WL2 ... WL8, for example the address lines WL4, WL8 may be connected to driver circuits 541 of the same active area line 531, 532. In the embodiment illustrated in FIGS. 5A-5B, the address lines WL4, WL8 are connected to driver circuits 541 formed in the first active area line 531 and the address lines WL2, WL6 are connected to driver circuits 541 formed in the second active area line 532.

The address lines WL2 ... WL8 may be formed as at least partly buried wiring lines, for example as buried gate wiring lines as described with regard to one of the preceding figures. The address lines WL2 ... WL8 may be connected via buried contact structures 522 as described above to one of the driver circuits 541. By way of example, the address lines WL2... WL8 may be formed as part of gate trench structures 528 that may further be disposed between adjacent driver circuits 541 which are formed in that active area line 531, 532 that does not include that driver circuit 541 which is connected to the respective address line WL2 ... WL8. Each buried contact structure 522 is placed between an n-doped source/drain region 581 of one of the n-FETs 542 and a p-doped source/drain region 583 of one of the p-FETs 543.

First contacts VS0, VS2, VS4, . . . may bear on those n-doped-source/drain regions 581 that are not connected to one of the buried contact structures 522 and second contacts VD0, VD2, VD4, . . . may bear on those p-doped source/drain regions 583 that are not connected to one of the buried contact structures 522. Via the first contacts VS0, VS2, VS4, . . . a first supply voltage, for example Vss, and via the second contacts VD0, VD2, VD4, . . . a second supply voltage, for example Vdd, may be supplied to the driver circuits 541.

The n-FETs 542 and/or the p-FETs 543 may be 3D field effect transistors with the gate electrode buried below the main surface 502 of the substrate 500 of the integrated circuit 599. Gate trenches 538, in which the gate electrodes are disposed, may be formed in the projection of those address lines WL3, WL5, VL7, . . . that are not connected to the driver circuits 541 at the illustrated edge of the cell array area 510. The formation of the gate trenches 538 may be combined with that of the gate trench structures 528 in view of the lithography and/or the etch process. Further buried contact structures 532 may be formed between the buried gate electrodes and the main surface 502. Gate contacts GC may bear on the further buried contact structures 532.

Figure 5B:
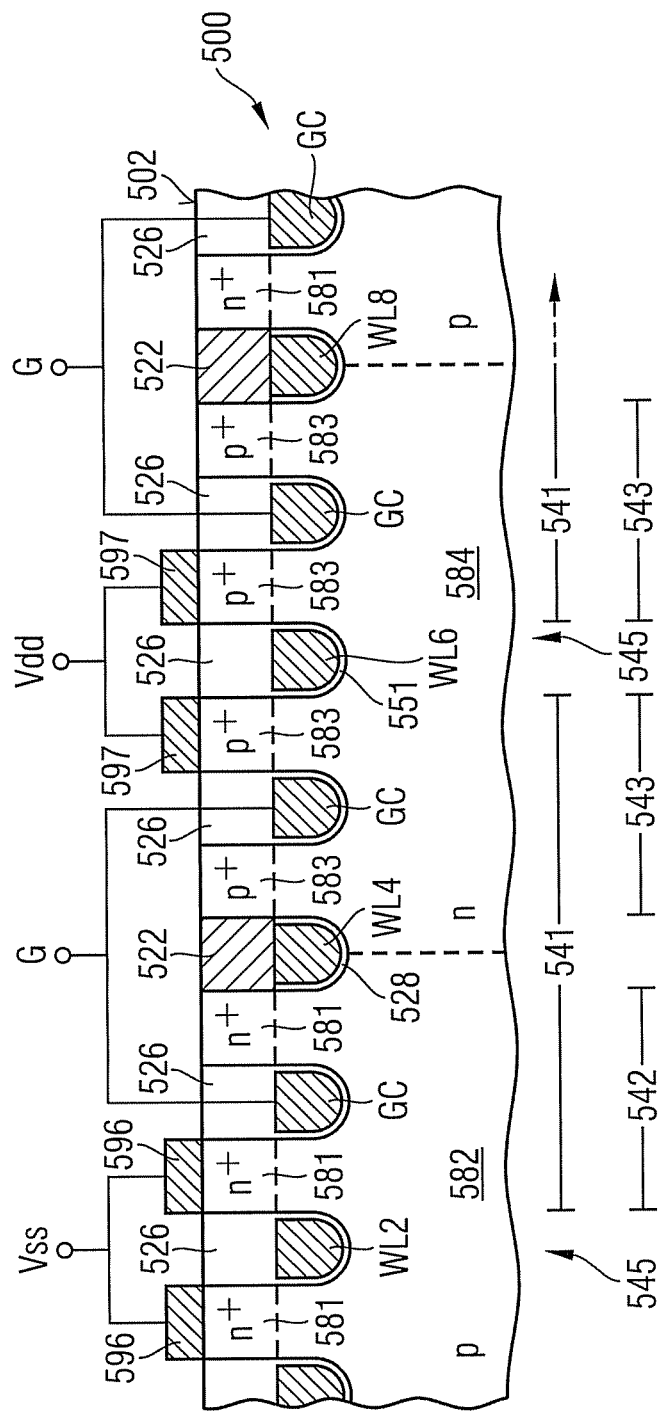

FIG. 5B illustrates a cross sectional view along the first active area line 531. As illustrated schematically, the gate contacts GC of the n-FET 542 and the p-FET 543 of the same driver circuit 541 may be connected to a common gate terminal G, the first contacts 596 may be connected to a terminal Vss and the second contacts 597 may be connected to a terminal Vdd. Each fourth address line WL2, . . . , WL8 is connected to one of the driver circuits 541 of the same active area line 531, 532. A section of each gate trench structure 528 is effective as an insulator structure 545, which is disposed between neighboring driver circuits 541 in that active area line 531, 532, the driver circuits 541 of which are not connected to that word line WL2, . . . , WL8 that is disposed in the gate trench structure 528 and separates them from each other.

The p-doped source/drain regions 583 are formed in an n-well 584 and the n-doped source/drain regions 581 are formed in a p-well 582. That gate trench structure 528, in which that address line WL2, . . . , WL8 is formed which is connected to the respective driver circuit 541, is disposed between separates the neighboring n-well 584 and the neighboring p-well 582 in a section adjacent to the source/drain regions 581, 583 and separates them from each other, wherein a first section of a gate dielectric liner 551 or another insulating liner is disposed between the respective address line WL2, . . . , WL8 and the neighboring wells. A second section of the gate dielectric liner 551 or another insulating liner may be disposed between the respective address line WL2, . . . , WL8 that is disposed in that gate trench structure 528 a section of which is effective as an insulator structure 545 on one hand and the neighboring n-well 584 or p-well 582. An insulator film 526 may be provided between the main surface 502 and the upper edge of the address lines WL2, . . . , WL8.

In accordance with another embodiment, neighboring contacts of the same type, for example neighboring first contacts 596 or neighboring second contacts 597 or neighboring third contacts GC may be formed as one contact, wherein overlay tolerances my be relaxed.

FIG. 6 is a plan view of an integrated circuit 699 including a ring isolator circuit 601 that includes a plurality of inverter circuits 602, wherein the output of an individual one of the inverter circuits 602 is connected to the input of the following inverter circuit 602 and wherein the output of the last inverter circuit 602 is connected to the input of the first inverter circuit 602. Individual ones of the inverter circuits 602 include a p-FET 602a, an n-FET 602b and a buried contact structure 622 that is formed in a groove below a main surface of a semiconductor substrate 600. The buried contact structure 622 adjoins first source/drain regions 611 of the field effect transistors 602a, 602b. A first gate electrode 603a is configured to control the p-FET 602a and the second gate electrode 603b is configured to control the n-FET 602b.

Each inverter circuit 602 includes further a buried output line 620, wherein at least a section of the buried output line 620 is buried below the buried contact structure 622 and is in direct, low-resistance contact with the buried contact structure 622. The buried output line 620 of at least one of the inverters circuits 602 is connected with the first and second gate electrodes 603a, 603b of the following inverter circuit 602.

The first and the second gate electrodes 603a, 603b may be buried below the main surface of the semiconductor substrate 600. For example, they may be buried in the same groove, in which the buried output line 620 of the preceding inverter circuit 602 is formed.

The field effect transistors 602a, 602b of each inverter circuit 602 may be arranged parallel to each other, wherein the first source/drain regions 611 and second source/drain regions 613 face each other at an intermediate insulator structure. The first and the second field effect transistors 602a, 602b may be arranged in a staggered manner or such that their second sides, which may be for example the narrow sides, are flush to each other. A groove including the buried output line 620 may extend perpendicular to the orientation of the field effect transistors 602a, 602b and may extend adjacent to the second sides of the first and the second field effect transistors 602a, 602b, wherein the second sides may extend perpendicular to a connection line between the first and second source/drain regions 611, 613 of the associated field effect transistor 602a, 602b.

The following inverter circuit 602 may be arranged accordingly. According to another embodiment, neighboring inverter circuits 602 may be arranged in a staggered manner such that the projection of the groove, in which the buried output line 620 of the first inverter circuit 602 is formed, may intersect the active areas of the second inverter circuit 602 between the first and second source/drain region 611, 613. The buried gate electrodes 603a, 603b of the second inverter circuit 602 and the buried output line 620 of the first inverter circuit 602 may be disposed in a contiguous, straight groove. Further, the second inverter circuit 602 may be arranged mirror-inverted to the first inverter circuit 602 with reference to an axis defined by a connection between the first and the second gate electrodes 603a, 603b, wherein a groove in which the buried output line 620 of the second inverter is formed extends along the projection of that groove, in which the buried gate electrodes 603a, 603b of the preceding inverter circuit 602 are formed. The field effect transistors 602a, 602b, the buried output lines 620 and the buried contact structures 622 may be formed in accordance with the field effect transistors, buried wiring lines and buried contact structures as discussed with regard to the preceding figures.

Figure 7A:
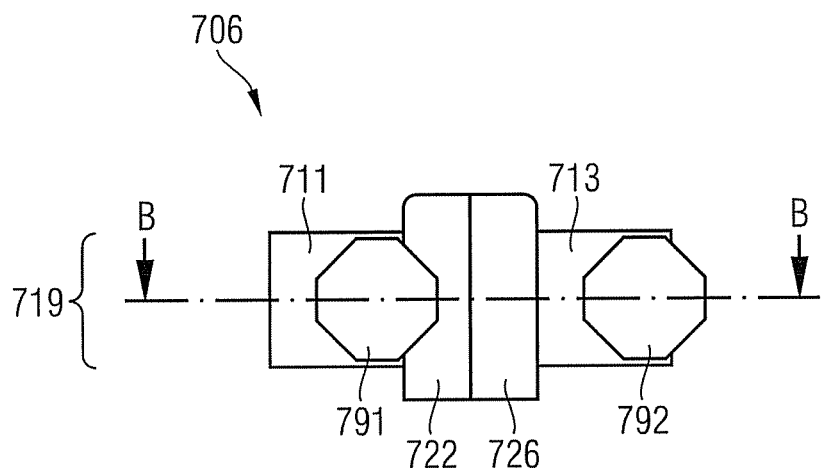
FIGS. 7A-7B illustrate respectively a plan view and a corresponding cross-sectional view of a portion of an integrated circuit including a 3D field effect transistor with a buried contact between the gate electrode and a source/drain region in accordance with one embodiment.
Figure 7B:
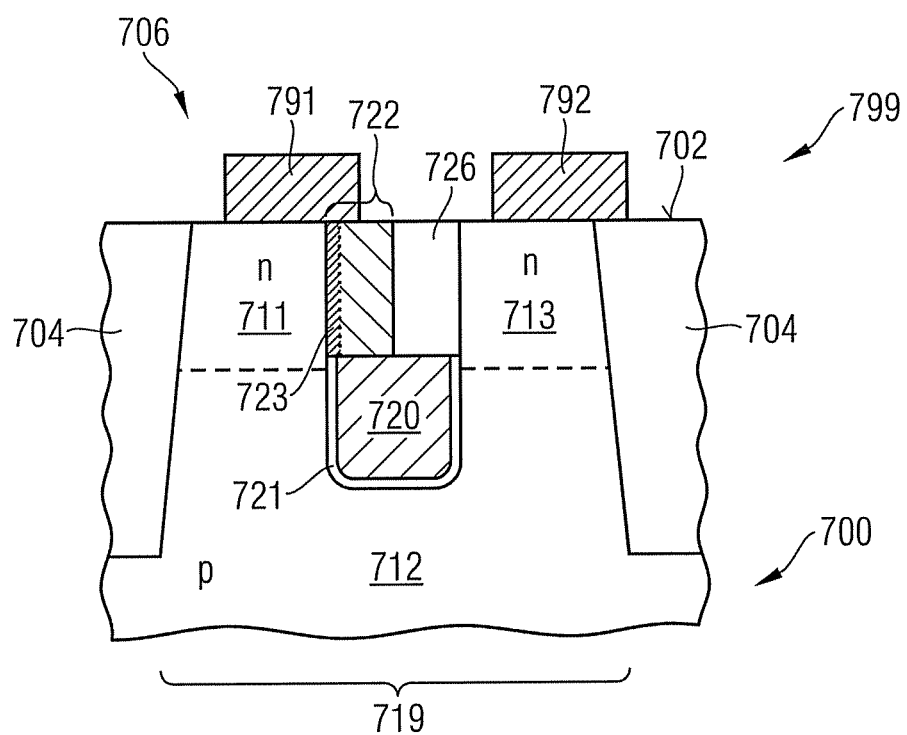

FIG. 7B is a cross-section of a section of an integrated circuit 799 that includes an n-FET 706 and a buried contact structure 722 according to a further embodiment. The n-FET 706 includes an active area 719 that is formed from a semiconductor substrate 700 and that includes a first and a second source/drain region 711, 713 adjoining to a main surface 702 of the substrate 700. A gate electrode 720 is buried below the main surface 702 and between the first and the second source/drain regions 711, 713. A gate dielectric 721 is arranged between the gate electrode 720 and a channel region 712 which connects the two source/drain regions 711, 713 within the active area 719. The gate electrode 720 may wrap partly around at least a section of the channel region 712. Insulator structures 704 extend at least on two opposing first sides of the active area 719, the first sides extending parallel to a connection line between the first and second source/drain regions 711, 713.

The buried contact structure 722 is formed between the main surface 702 and an upper edge of the gate electrode 720 and is in direct, low-resistive contact with the gate electrode 720 and one of the source/drain regions 711, 713. A contact 791 may be formed on the main surface 702 and may be in direct, low-resistive contact with both an upper edge of the first source/drain region 711 and the buried contact structure 722. A further contact 792 may bear on the second source/drain region 713.

Referring to the corresponding plan view illustrated in FIG. 7A, the buried contact structure 722 may provide a space-saving contact scheme in the plane of the contacts 791, 792. An insulator film 726 may be arranged between the gate electrode 720 and the second source/drain region 713. A high conductive interface liner 723, for example a silicide liner, may be part of the buried contact structure 722 and may extend along an interface to the first source/drain region 711. Individual features of the integrated circuit 799 may be formed accordingly to and/or in combination with individual features of the integrated circuits, field effect transistors, contact structures and contacts as described with regard to the preceding figures.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
a field effect transistor including a first active area and a gate electrode buried below a main surface of a semiconductor substrate;
a gate wiring line buried below the main surface, wherein a section of the gate wiring line forms the gate electrode;
a buried contact element in direct contact with the gate wiring line, wherein a top of the buried contact element is substantially flush with or recessed below the main surface; and
a second active area formed in the semiconductor substrate adjacent to and in direct contact with the buried contact element;
wherein the gate electrode is buried between a first and a second source/drain region of the field effect transistor that are formed within the first active area and adjacent to the main surface;
wherein the second active area comprises a further first and a further second source/drain region of a second field effect transistor; and
wherein the buried contact element is formed adjacent to and in direct contact with one of the further first or second source/drain regions.

2. The integrated circuit of claim 1, wherein the further first and second source/drain regions adjoin to the main surface, and
the second field effect transistor comprises a second gate electrode buried below the main surface and between the further first and second source/drain regions.

3. The integrated circuit of claim 1, further comprising
a third field effect transistor including an active area adjacent to and in direct contact with the buried contact element.

4. The integrated circuit of claim 3, wherein the third field effect transistor faces the second field effect transistor at the buried contact element.

5. An integrated circuit comprising:
a plurality of field effect transistors, each of them including a gate electrode buried below a main surface of a semiconductor substrate;
an address line including and connecting the gate electrodes and completely buried below the main surface;
a buried contact element adjacent to and in direct contact with the address line and buried below the main surface; and
a driver circuit configured to drive the address line and comprising a combined active area that is adjacent to and in direct contact with the buried contact element.

6. The integrated circuit of claim 5, wherein the driver circuit comprises:
an n-FET including a first active area and a p-FET including a second active area, wherein the first and the second active areas are formed within the combined active area and are adjacent to and in direct contact with the buried contact element.

7. The integrated circuit of claim 6, wherein the n-FET comprises a first further gate electrode and the p-FET comprises a second further gate electrode, wherein the first and second further gate electrodes are buried below the main surface.

8. The integrated circuit of claim 6, wherein the n-FET and the p-FET face each other at opposing sides of the buried contact element.

9. The integrated circuit of claim 8, wherein a groove structure, in which the address line is buried, is disposed between the first and the second active areas and has a lower edge with a greater distance to the main surface than a lower edge of source/drain regions of the n-FET and the p-FET that are formed in the first and second active areas adjacent to the groove structure.

10. An integrated circuit comprising an inverter circuit comprising:
   an n-FET;
   a p-FET, wherein a first source/drain region of the p-FET is in low resistance contact with a second source/drain region of the n-FET and wherein the first source/drain region of the p-FET and the second source/drain region of the n-FET adjoin to a main surface of a semiconductor substrate; and
   a buried contact element formed in a groove and buried below the main surface, the buried contact element being arranged between and being in direct contact with the first source/drain region of the p-FET and the second source/drain region of the n-FET,
   wherein a lower edge of the groove has a greater distance to the main surface than a lower edge of the first source/drain region of the p-FET and the second source/drain region of the n-FET.

11. The integrated circuit of claim 10, further comprising:
   a buried output line, a section of which is buried below and in direct contact with the buried contact element.

12. The integrated circuit of claim 11, wherein a first gate electrode configured to control the n-FET and a second gate electrode configured to control the p-FET are buried below the main surface.

13. The integrated circuit of claim 12, wherein an upper edge of at least one of the first and second gate electrodes is approximately flush with an upper edge of the buried output line.

14. An integrated circuit comprising a ring oscillator circuit including a plurality of inverter circuits, wherein individual ones of the inverter circuits comprise:
   a buried contact element, at least a section of which is formed below a main surface of a semiconductor substrate and adjoins a first source/drain region of a p-FET that includes a first gate electrode and a second source/drain region of an n-FET that includes a second gate electrode, the first and the second source/drain regions formed below and directly adjacent to the main surface; and
   a buried output line, at least a section of which is buried below and in direct contact with the buried contact element,
   wherein the buried output lines of individual ones of the inverter circuits are connected with the first and second gate electrodes of one of the other inverter circuits.

15. The integrated circuit of claim 14, wherein the first and the second gate electrodes are buried below the main surface.

16. The integrated circuit of claim 14, wherein an upper edge of the first and second gate electrodes is approximately flush with an upper edge of the buried output lines.

17. The integrated circuit of claim 14, further comprising:
   further buried contact elements formed between an upper edge of the first and second gate electrodes of one of the other inverter circuits and the main surface.

18. An integrated circuit comprising:
   a field effect transistor including a first active area of a plurality of active areas formed in a semiconductor substrate, the field effect transistor comprising a first and a second source/drain region, wherein the first and the second source/drain regions directly adjoin to a main surface of the semiconductor substrate, and a gate electrode that is buried below the main surface and between the first and the second source/drain regions; and
   a conductive buried contact element in contact with the gate electrode and adjoining at least one of the plurality of active areas,
   wherein the distance between the buried contact element and one of the source and drain regions is not greater than two times the distance between the source region and the drain region.

19. The integrated circuit of claim 18, wherein a distance between the source region and the buried contact element is approximately equal to a distance between the drain region and the buried contact structure.

20. The integrated circuit of claim 19, wherein the distance between the source region and the buried contact element is approximately equal to a distance between the drain region and the source region.

21. The integrated circuit of claim 18, wherein the buried contact element is disposed above and in direct contact with the gate electrode, between the first and the second source/drain regions and in direct contact with one of the first and the second source/drain regions.

* * * * *